United States Patent
Kang et al.

(10) Patent No.: US 8,652,910 B2
(45) Date of Patent: Feb. 18, 2014

(54) METHOD FOR FABRICATING SEMICONDUCTOR DEVICE AND DEVICE USING SAME

(75) Inventors: Bo-Kyeong Kang, Seoul (KR);
Jae-Seok Kim, Seoul (KR); Ho-Young Kim, Seongnam-si (KR); Bo-Un Yoon, Seoul (KR); Il-Young Yoon, Hwaseong-si (KP)

(73) Assignee: Samsung Electronics Co., Ltd. (KR)

( * ) Notice: Subject to any disclaimer, the term of this patent is extended or adjusted under 35 U.S.C. 154(b) by 148 days.

(21) Appl. No.: 13/438,250

(22) Filed: Apr. 3, 2012

(65) Prior Publication Data

US 2012/0315732 A1 Dec. 13, 2012

(30) Foreign Application Priority Data

Jun. 9, 2011 (KR) ........................ 10-2011-0055704

(51) Int. Cl.
*H01L 21/336* (2006.01)

(52) U.S. Cl.
USPC .................. 438/284; 438/589; 257/E21.429; 257/E21.434

(58) Field of Classification Search
USPC ......... 438/284, 589, FOR. 193; 257/E21.429, 257/E21.434
See application file for complete search history.

(56) References Cited

U.S. PATENT DOCUMENTS

| | | | | |
|---|---|---|---|---|
| 7,074,662 B2 * | 7/2006 | Lee et al. | ....................... | 438/199 |
| 7,501,674 B2 | 3/2009 | Lee et al. | | |
| 7,842,594 B2 * | 11/2010 | Cho et al. | ...................... | 438/589 |
| 8,264,048 B2 * | 9/2012 | Rachmady et al. | ........... | 257/401 |
| 8,309,425 B2 * | 11/2012 | Oshima | ........................ | 438/424 |
| 2006/0081895 A1 | 4/2006 | Lee et al. | | |
| 2008/0099858 A1 * | 5/2008 | Kawakita | ...................... | 257/401 |
| 2009/0174001 A1 | 7/2009 | Lee et al. | | |
| 2010/0035398 A1 * | 2/2010 | Oh et al. | ....................... | 438/285 |
| 2010/0167475 A1 * | 7/2010 | Nara | .............................. | 438/157 |
| 2011/0284969 A1 * | 11/2011 | Wu | .................................. | 257/368 |
| 2012/0235234 A1 * | 9/2012 | Chang et al. | .................. | 257/347 |
| 2012/0280330 A1 * | 11/2012 | Lee et al. | ....................... | 257/392 |
| 2012/0315732 A1 * | 12/2012 | Kang et al. | ..................... | 438/197 |
| 2013/0200470 A1 * | 8/2013 | Liu et al. | ....................... | 257/408 |

FOREIGN PATENT DOCUMENTS

| | | |
|---|---|---|
| JP | 2006339514 | 12/2006 |
| JP | 2007165772 | 6/2007 |
| KR | 1020060034531 | 4/2006 |

* cited by examiner

*Primary Examiner* — George Fourson, III
(74) *Attorney, Agent, or Firm* — Onello & Mello, LLP

(57) ABSTRACT

In a method for fabricating a semiconductor device, a substrate may be provided that includes: a base, an active fin that projects from an upper surface of the base and is integrally formed with the base, and a buffer oxide film pattern formed on the active fin in contact with the active fin. A first dummy gate film may be formed on the substrate to cover the buffer oxide film pattern and the first dummy gate film may be smoothed to expose the buffer oxide film pattern. A second dummy gate film may be formed on the exposed buffer oxide film pattern and the first dummy gate film.

15 Claims, 16 Drawing Sheets

METHOD FOR FABRICATING SEMICONDUCTOR DEVICE AND DEVICE USING SAME

CROSS-REFERENCE TO RELATED APPLICATIONS

This application is based on and claims priority from Korean Patent Application No. 10-2011-0055704, filed on Jun. 9, 2011 in the Korean Intellectual Property Office, the disclosure of which is incorporated herein in its entirety by reference.

BACKGROUND

1. Field

Embodiments of the present inventive concepts relate to a method for fabricating a semiconductor device, and devices made thereby.

2. Description of the Background

As semiconductor devices have become more compact, higher-speed, and lower-voltage, planar semiconductor devices have begun to exhibit undesirable characteristics. For example, the short-channel effect increases "off-state" leakage current, which increase the power requirements of a device, even when it is not operating. In response to these problems and other problems associated with planar field effect transistors (FETs), non-planar, multi-gate devices have been developed. A multi-gate device employs a plurality of gates around a FET's channel to more effectively suppress "off-state" leakage current. Additionally, multiple gates afford greater drive current in the "on-state." Lower "off-state" current and greater "on-state" current yields lower power consumption and greater drive performance for a multi-gate FET. Non-planar devices also offer the advantage of greater compactness. Non-planar multi-gate devices that employ a conducting channel wrapped in a "fin" of silicon may be referred to as FinFETs.

A gate-last process, may be used to form a FinFET. In such a process, a source region and a drain region are formed in an active fin of a FinFET on either side of an area where a gate is to be formed, followed by formation of a gate electrode (which may be, for example, a metal electrode).

In such a process, in order to form the source region and the drain region in the active fin, a dummy gate pattern may be formed on the active fin before forming the gate electrode. In general, such a dummy gate pattern may be formed by forming a dummy gate film on an upper portion of a substrate that includes a base and an active fin and then patterning the formed dummy gate film.

However, because the Fin FET is formed so that the active fin projects from the base, a stepped portion is formed while the dummy gate film is formed. Patterning a dummy gate film having a stepped portion (due to underlying an underlying fin) to form a dummy gate may preclude proper node separation between devices, with negative consequences for product reliability.

SUMMARY

Accordingly, a method of forming a FinFET in accordance with principles of inventive concepts may be employed to fabricate semiconductor devices having higher reliability.

Additional advantages, subjects, and features of a process in accordance with principles of inventive concepts will be set forth in part in the description which follows and in part will become apparent to those having ordinary skill in the art upon examination of the following or may be learned from practice of the inventive concepts.

In an exemplary method for fabricating a semiconductor device in accordance with principles of inventive concepts, a substrate that includes a base, an active fin that projects from an upper surface of the base and is integrally formed with the base, and a buffer oxide film pattern formed on the active fin in contact with the active fin may be provided. A first dummy gate film may be formed on the substrate to cover the buffer oxide film pattern. The first dummy gate film may be smoothed to expose the buffer oxide film pattern, and a second dummy gate film may be formed on the exposed buffer oxide film pattern and the first dummy gate film.

In another exemplary method for fabricating a semiconductor device in accordance with principles of inventive concepts, a substrate that includes a base, an active fin that projects from an upper surface of the base and is integrally formed with the base, and an end point pattern formed on the active fin in contact with the active fin may be provided. A first dummy gate film may be formed on the substrate to cover the end point pattern, and the first dummy gate film may be smoothed to expose the smoothed end point pattern. A second dummy gate film may be formed on the exposed smoothed end point pattern and the first dummy gate film. A dummy gate pattern may be formed by patterning the first and second dummy gate films, and a metal gate pattern may be formed after removing the dummy gate pattern.

In an exemplary method of fabricating a semiconductor device in accordance with principles of inventive concepts may include providing a substrate that includes a base, an active fin that projects from an upper surface of the base and is integrally formed with the base, and a buffer oxide film pattern formed on the active fin in contact with the active fin; forming a first dummy gate film on the substrate to cover the buffer oxide film pattern; smoothing the first dummy gate film to expose the buffer oxide film pattern; and forming a second dummy gate film on the exposed buffer oxide film pattern and the first dummy gate film.

In an exemplary method of fabricating a semiconductor device in accordance with principles of inventive concepts may include smoothing a first dummy gate film through a CMP process using etching selectivity between the buffer oxide film pattern and the first dummy gate film.

In an exemplary method of fabricating a semiconductor device in accordance with principles of inventive concepts may include providing a first dummy gate film and second dummy gate film that include the same material.

In an exemplary method of fabricating a semiconductor device in accordance with principles of inventive concepts may include providing a substrate that includes an isolation film pattern formed on the base to expose an upper side wall of the active fin; forming the buffer oxide film pattern and a hard mask film pattern on the substrate; and forming the active fin and the isolation film pattern using the hard mask film pattern.

In an exemplary method of fabricating a semiconductor device in accordance with principles of inventive concepts may include forming an active fin and isolation film pattern using the hard mask film pattern by forming the active fin by etching the base using the hard mask film pattern as a mask; forming the isolation film on the base to cover the hard mask film pattern; smoothing the isolation film to expose the hard mask film pattern; and forming the isolation film pattern that exposes an upper side wall of the active fin by etching the isolation film using the exposed hard mask film pattern as a mask.

In an exemplary method of fabricating a semiconductor device in accordance with principles of inventive concepts may include removing the hard mask film pattern.

In an exemplary method of fabricating a semiconductor device in accordance with principles of inventive concepts may include providing an upper surface of the second dummy gate film that is formed on the isolation film pattern and an upper surface of the second dummy gate film that is formed on the active fin positioned at the same height relative to the base.

In an exemplary method of fabricating a semiconductor device in accordance with principles of inventive concepts may include providing a substrate including a hard mask film pattern formed on the buffer oxide film pattern; wherein the forming the first dummy gate film further comprises forming the first dummy gate film to cover the hard mask film pattern, and the smoothing the first dummy gate film comprises firstly smoothing the first dummy gate film to expose the hard mask film pattern, exposing the buffer oxide film pattern by removing the hard mask film pattern, and secondarily smoothing the first fumy gate film so that the upper surface of the exposed buffer oxide film pattern and the upper surface of the first dummy gate film are positioned at the same height relative to the base.

In an exemplary method of fabricating a semiconductor device in accordance with principles of inventive concepts may include removing the hard mask film pattern through an etching process using etching selectivity among the first dummy gate film, the buffer oxide film pattern, and the hard mask film pattern.

In an exemplary method of fabricating a semiconductor device in accordance with principles of inventive concepts may include providing a substrate that includes a base, an active fin that projects from an upper surface of the base and is integrally formed with the base, and an end point pattern formed on the active fin in contact with the active fin; forming a first dummy gate film on the substrate to cover the end point pattern; smoothing the first dummy gate film to expose the smoothed end point pattern; forming a second dummy gate film on the exposed smoothed end point pattern and the first dummy gate film; forming a dummy gate pattern by patterning the first and second dummy gate films; and forming a metal gate pattern that is made of a metal after removing the dummy gate pattern.

In an exemplary method of fabricating a semiconductor device in accordance with principles of inventive concepts may include providing a buffer oxide film pattern as an endpoint pattern.

In an exemplary method of fabricating a semiconductor device in accordance with principles of inventive concepts may include providing an end point pattern that includes a buffer oxide film pattern that is formed to be in contact with the active fin and a hard mask film pattern that is formed on the buffer oxide film pattern; wherein the forming the first dummy gate film further comprises forming the first dummy gate film to cover the hard mask film pattern, the smoothing the first dummy gate film comprises firstly smoothing the first dummy gate film to expose the hard mask film pattern, exposing the buffer oxide film pattern by removing the hard mask film pattern, and secondarily smoothing the first fumy gate film so that the upper surface of the exposed buffer oxide film pattern and the upper surface of the first dummy gate film are positioned at the same height relative to the base; and the forming the second dummy gate film comprises forming the second dummy gate film on the exposed buffer oxide film pattern and the first dummy gate film.

In an exemplary method of fabricating a semiconductor device in accordance with principles of inventive concepts may include forming a source region and a drain region on the active fin, on either side of the dummy gate pattern, after forming the dummy gate pattern.

In an exemplary method of fabricating a semiconductor device in accordance with principles of inventive concepts may include forming the dummy gate pattern as the metal gate pattern by forming an interlayer insulating film pattern between the dummy gate patterns; exposing the active fin by removing the dummy gate pattern and the end point pattern using the interlayer insulating film pattern as a mask; and forming the metal gate pattern by filling the metal on the active fin.

In an exemplary method of fabricating a semiconductor device in accordance with principles of inventive concepts may include providing a metal gate pattern that includes aluminum.

In an exemplary embodiment in accordance with principles of inventive concepts a semiconductor device may include: a substrate; an active fin of semiconductor material including source and drain regions on the substrate; and a gate pattern configured to provide a channel between the source and drain regions of the active fin, wherein the gate pattern includes upper and lower surfaces and the upper surface includes no fin-related projection.

In an exemplary embodiment in accordance with principles of inventive concepts a semiconductor device may include a metal gate pattern.

In an exemplary embodiment in accordance with principles of inventive concepts a semiconductor device may include a gate pattern that includes aluminum.

In an exemplary embodiment in accordance with principles of inventive concepts a semiconductor device may include an interlayer insulating film formed over the active fin, the upper surface of the interlayer insulating film being coplanar with the upper surface of the gate pattern.

In an exemplary embodiment in accordance with principles of inventive concepts a semiconductor device may include source and drain regions of the active fin defined by the gate pattern.

BRIEF DESCRIPTION OF THE DRAWINGS

The above and other objects, features and advantages of the present inventive concepts will be more apparent from the following detailed description taken in conjunction with the accompanying drawings, in which.

DETAILED DESCRIPTION OF THE EMBODIMENTS

Figure 1:
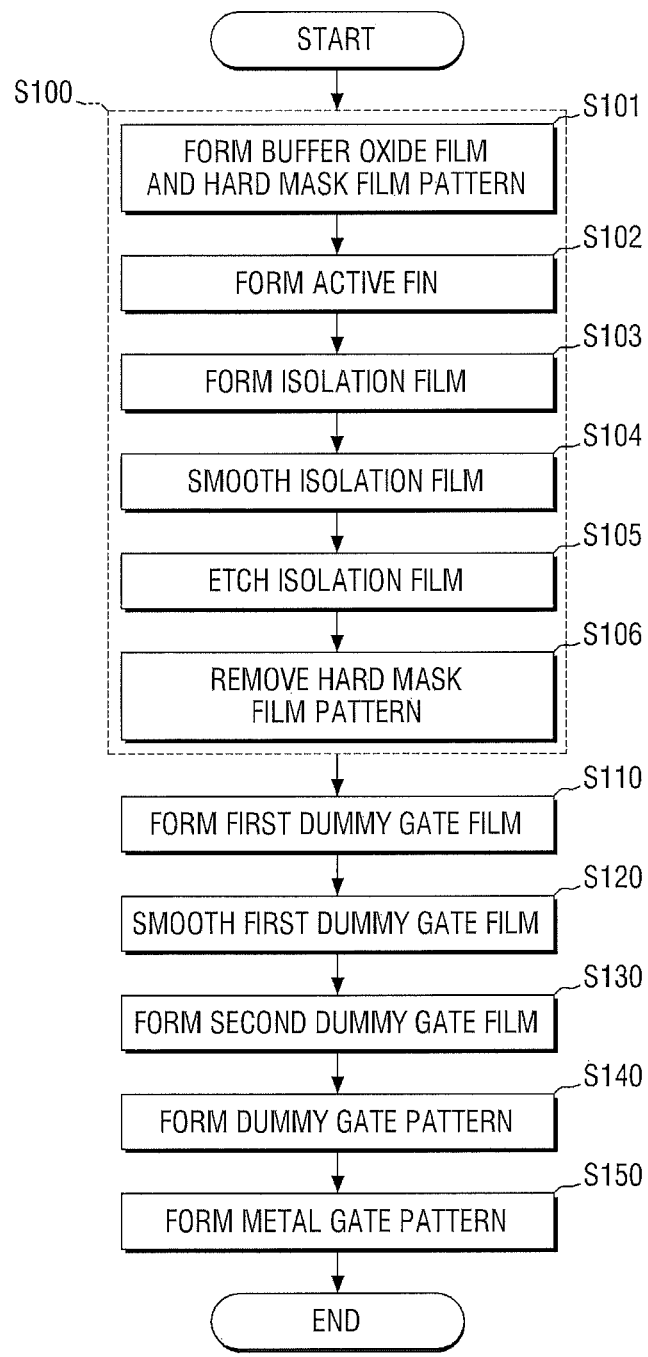
FIG. 1 is a flowchart illustrating a method for fabricating a semiconductor device according to an embodiment in accordance with principles of inventive concepts.

Exemplary embodiments of the inventive concepts will now be described more fully with reference to the accompanying drawings, in which exemplary embodiments of the inventive concept are shown. Exemplary embodiments of the inventive concept may, however, be embodied in many different forms and should not be construed as limited to the embodiments set forth herein; rather, these exemplary embodiments of the inventive concept are provided so that this description will be thorough and complete, and will fully convey the concept of exemplary embodiments of the inventive concept to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated, for example, 90 degrees or at other orientations) and the spatially relative descriptors used herein interpreted accordingly.

The terminology used herein is for the purpose of describing particular exemplary embodiments of the inventive concept only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concept are described herein with reference to cross-sectional illustrations that are schematic illustrations of idealized exemplary embodiments of the inventive concept (and intermediate structures). As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terms "film" and "layer" may be used interchangeably herein. Hereinafter, with reference to FIGS. 1 to 12, a method for fabricating a semiconductor device according to an exemplary embodiment in accordance with principles of inventive concepts will be described.

FIG. 1 is a flowchart illustrating a method for fabricating a semiconductor device according to an exemplary embodiment in accordance with principles of inventive concepts. FIGS. 2 to 12 are views explaining intermediate steps of a method for fabricating a semiconductor device according to an exemplary embodiment in accordance with principles of inventive concepts.

Referring to FIGS. 1 to 7, a substrate 200 may be provided (S100). Substrate 200 may include base 100, active fin 130 that projects from an upper surface of base 100 and is integrally formed with base 100, and an end point pattern 110 formed on active fin 130 in contact with active fin 130. In an exemplary embodiment in accordance with principles of inventive concepts, such an end point pattern may be a buffer oxide film pattern 110, for example.

Hereinafter, with reference to FIGS. 1 to 7, an exemplary embodiment of a method for providing such a substrate 200 in accordance with principles of inventive concepts will be described in detail.

Figure 2:
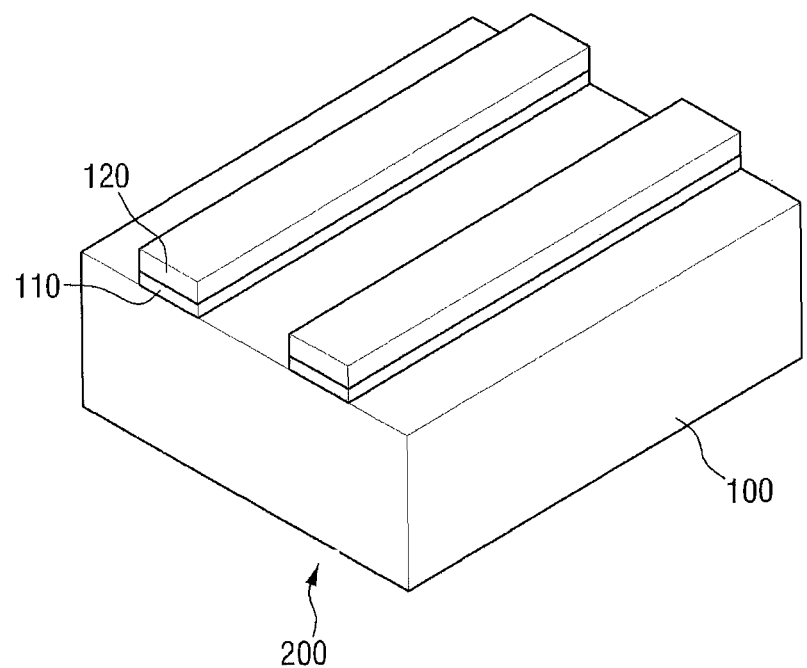
FIGS. 2 to 12 are views explaining intermediate steps of a method for fabricating a semiconductor device according to an embodiment in accordance with principles of inventive concepts.

Referring to FIGS. 1 and 2, buffer oxide film pattern 110 and hard mask film pattern 120 are formed (S101). Specifically, a buffer oxide film (not illustrated) and a hard mask film (not illustrated) are formed on base 100. Then, for example, a photoresist pattern (not illustrated) may be formed on the hard mask film (not illustrated), and buffer oxide film pattern 110 and hard mask film pattern 120 are formed on base 100, as illustrated in FIG. 2, by patterning the buffer oxide film (not illustrated) and the hard mask film (not illustrated) using the formed photoresist pattern as a mask.

The hard mask film pattern 120 may be made of a material having etching selectivity with respect to base 100, and buffer oxide film pattern 110 may be made of a material that buffers stress between base 100 and hard mask film pattern 120. Examples of such materials may be hard mask film pattern 120 including a silicon nitride film (SiN) and buffer oxide film pattern 110 including a silicon oxide film (SiOx), for example.

Figure 3:
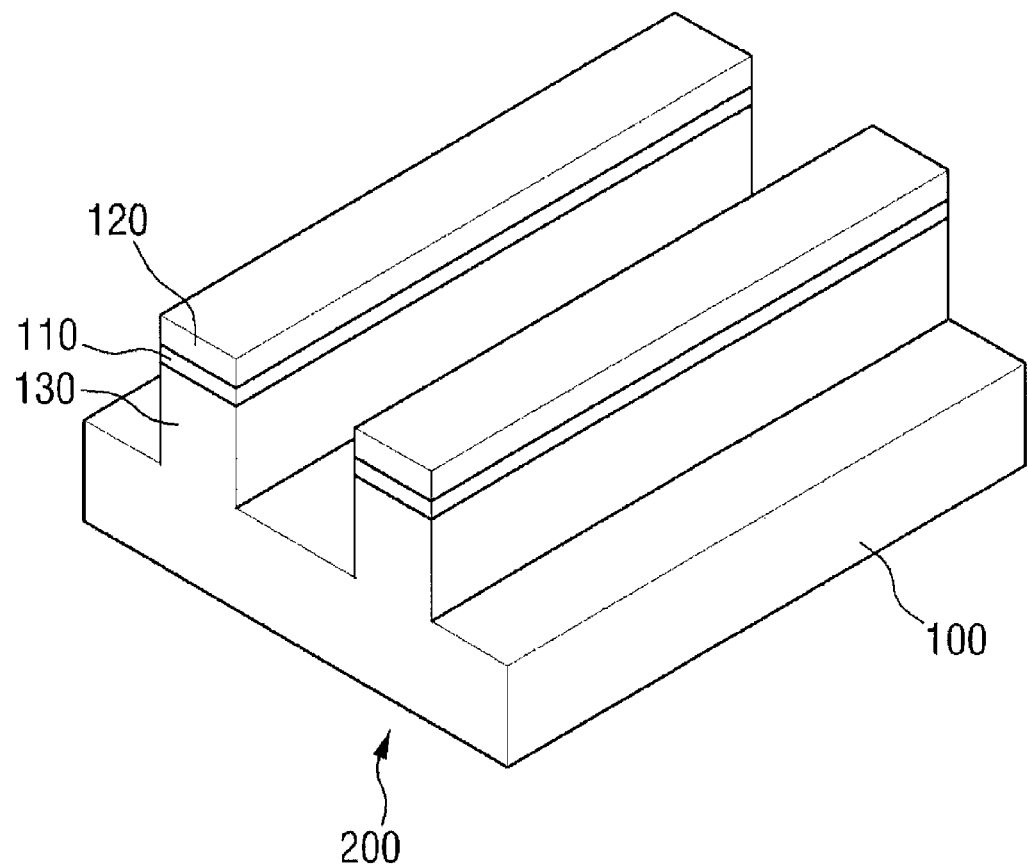

Referring to FIGS. 1 and 3, active fin 130 may be formed (S102) using hard mask film pattern 120. For example, active fin 130, which projects from the upper surface of base 100 and is integrally formed with base 100, may be formed by etching base 100 using hard mask film pattern 120 as a mask.

Hard mask film pattern 120, as described above, may be formed of a material having etching selectivity with respect to base 100. Accordingly, base 100 in the region where hard mask film pattern 120 is formed is not etched, and only base 100 in the region where hard mask film pattern 120 is not formed is etched. As a result, active fin 130 is formed on a lower portion of hard mask film pattern 120, which projects from the upper surface of base 100 and is integrally formed with base 100.

Figure 4:
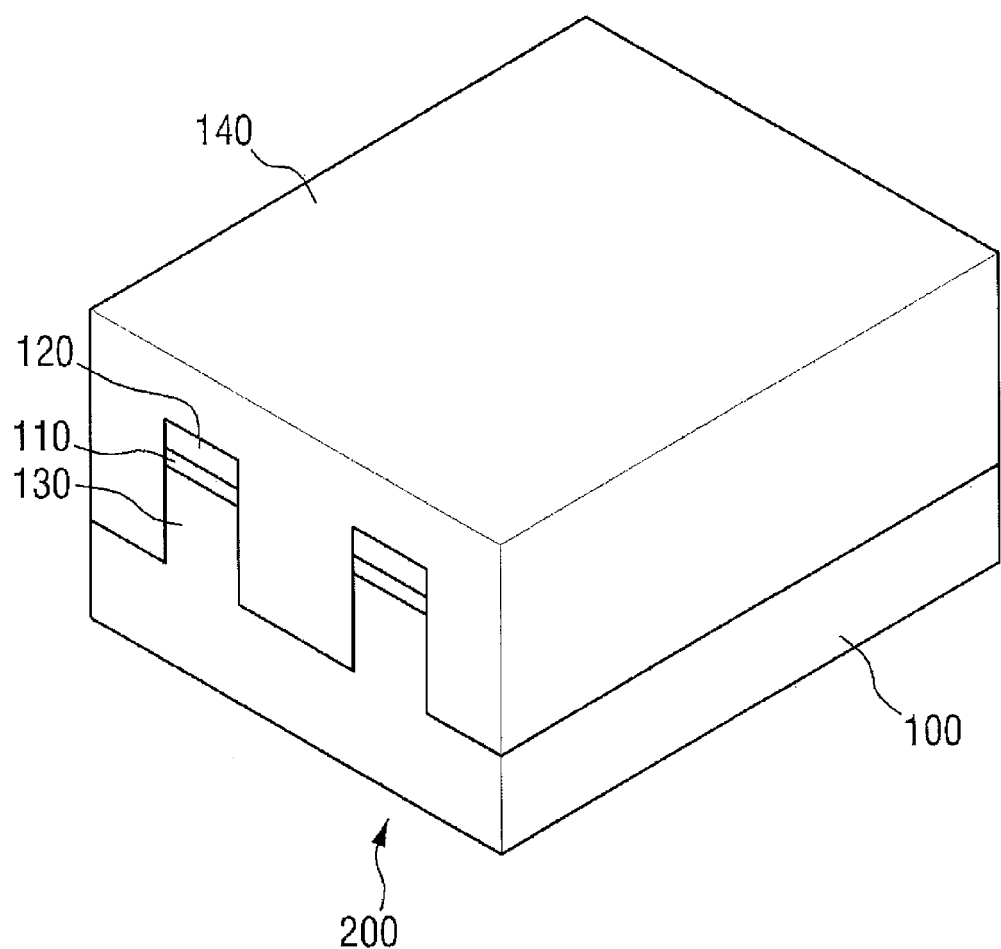

Referring to FIGS. 1 and 4, isolation film 140 may be formed (S103) on base 100 to cover hard mask film pattern 120. Isolation film 140 may be made of an insulating oxide film for separating the active fins 130 from each other, for example.

Figure 5:
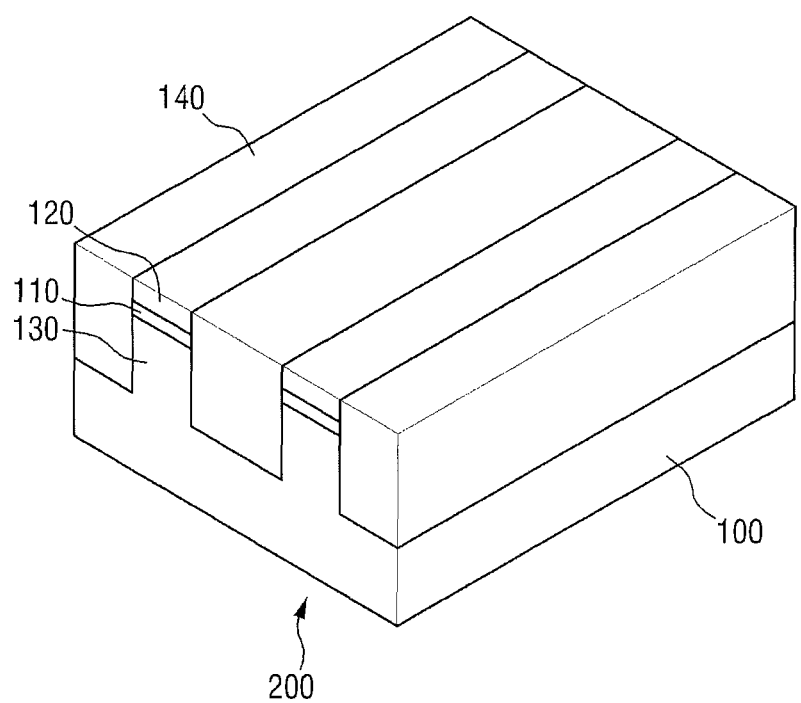

Referring to FIGS. 1 and 5, isolation film 140 may be smoothed (S104) to expose hard mask film pattern 120.

Figure 6:
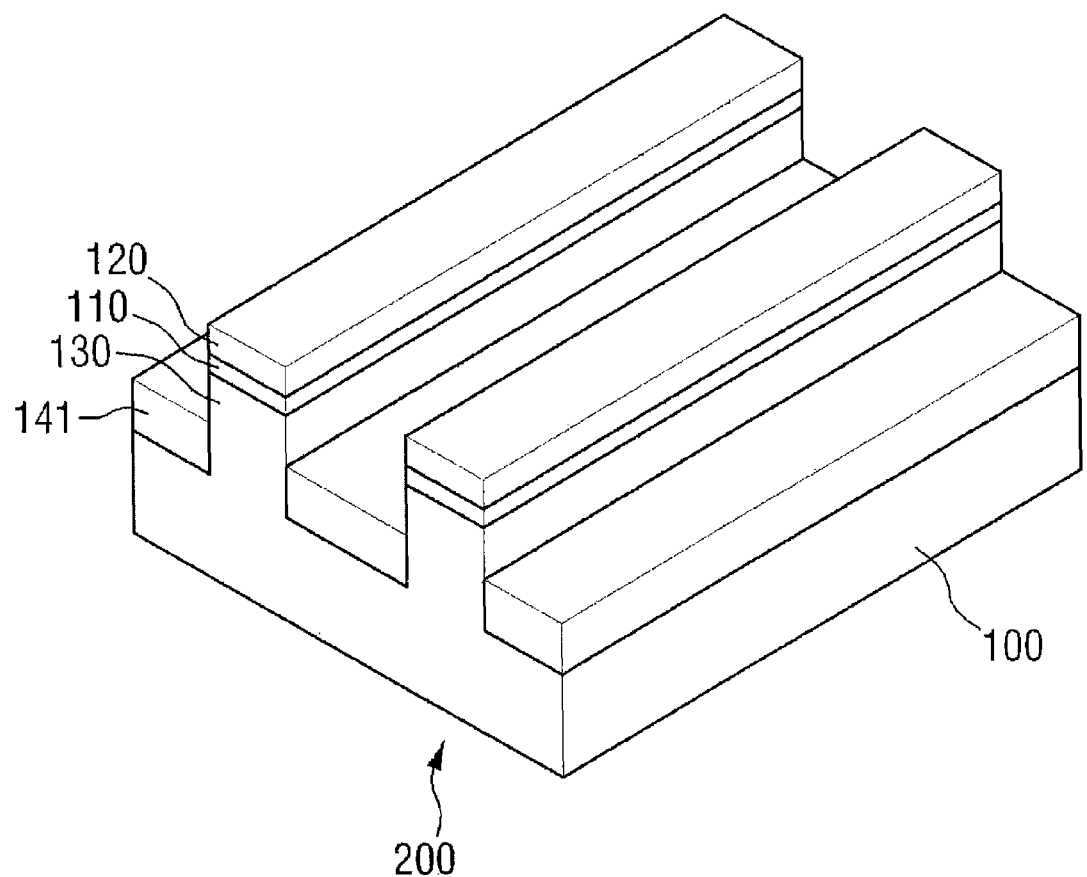

Referring to FIGS. 1 and 6, isolation film 140 may be etched (S105). In an exemplary embodiment in accordance with principles of inventive concepts, an isolation film pattern 141 that exposes an upper side wall of active fin 130 may be formed by etching isolation film 140 using exposed hard mask film pattern 120 as a mask. In this case, the size of the upper side wall of exposed active fin 130 may be adjusted by adjusting the etching time of isolation film 140. Isolation film pattern 141 formed through the above-described etching process may be formed to cover a lower side wall of active fin 130 in an exemplary embodiment in accordance with principles of inventive concepts.

Figure 7:
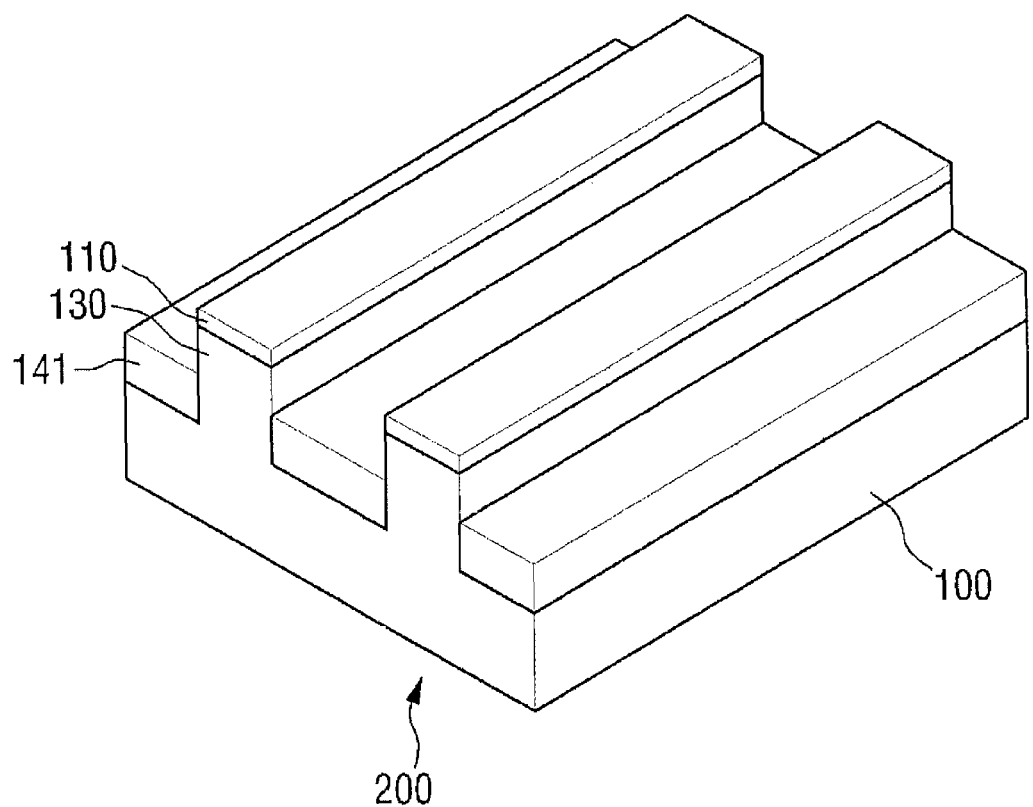

Referring to FIGS. 1 and 7, hard mask film pattern 120 may be removed (S106). Specifically, buffer oxide film pattern 110 may be exposed by removing hard mask film pattern 120, as illustrated, through an etching process using etching selectivity among buffer oxide film pattern 110, isolation film pattern 141, and hard mask film pattern 120.

Through the above-described process, substrate 200, which includes base 100, active fin 130 that projects from the upper surface of base 100 and is integrally formed with base 100, and buffer oxide film pattern 110 formed on active fin 130 in contact with active fin 130, may be provided. However, the above-described processes are merely exemplary processes for providing substrate 200, and the present inventive concepts is not limited thereto.

Figure 8:
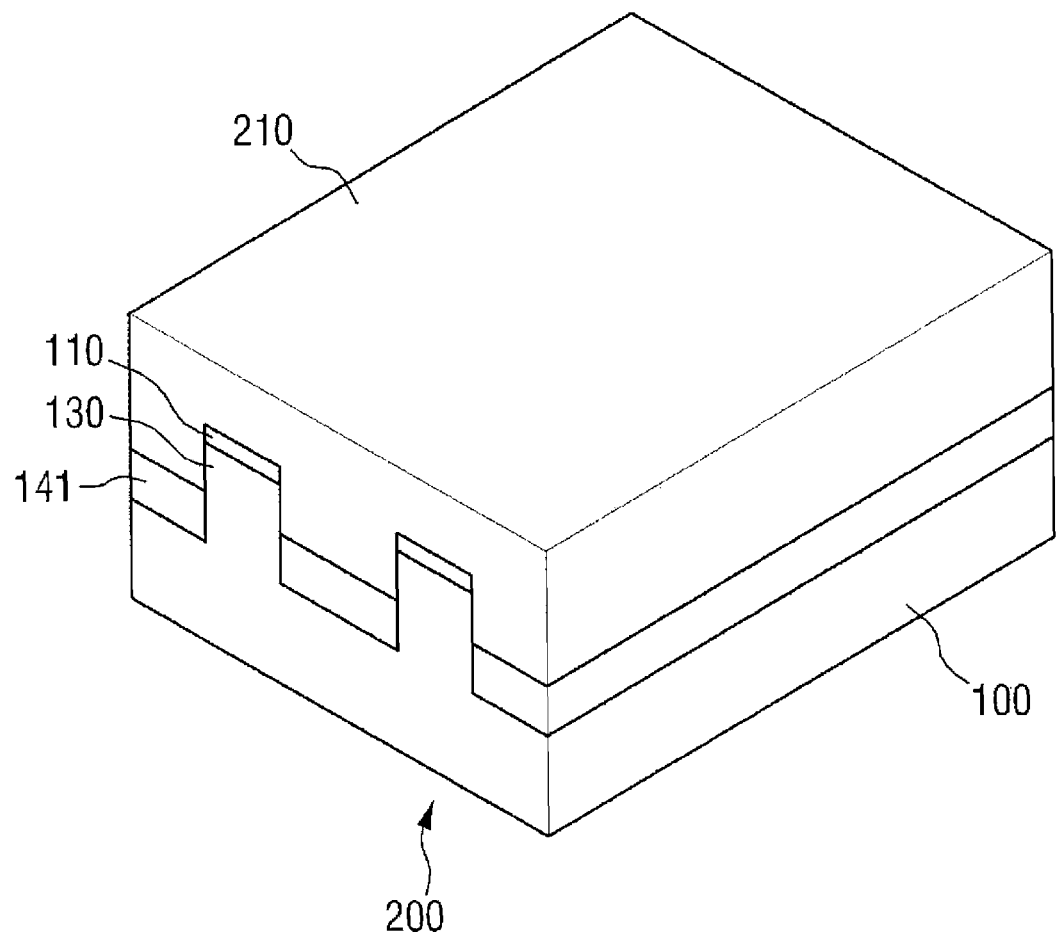

Referring to FIGS. 1 and 8, a first dummy gate film 210 may be formed (S110) on substrate 200 to cover buffer oxide film pattern 110. In this exemplary embodiment, in accordance with principles of inventive concepts, first dummy gate film 210 may be made of a material having an etching selectivity with respect to buffer oxide film pattern 110. The material that forms first dummy gate film 210, for example, may be polysilicon (poly-Si), for example.

Figure 9:
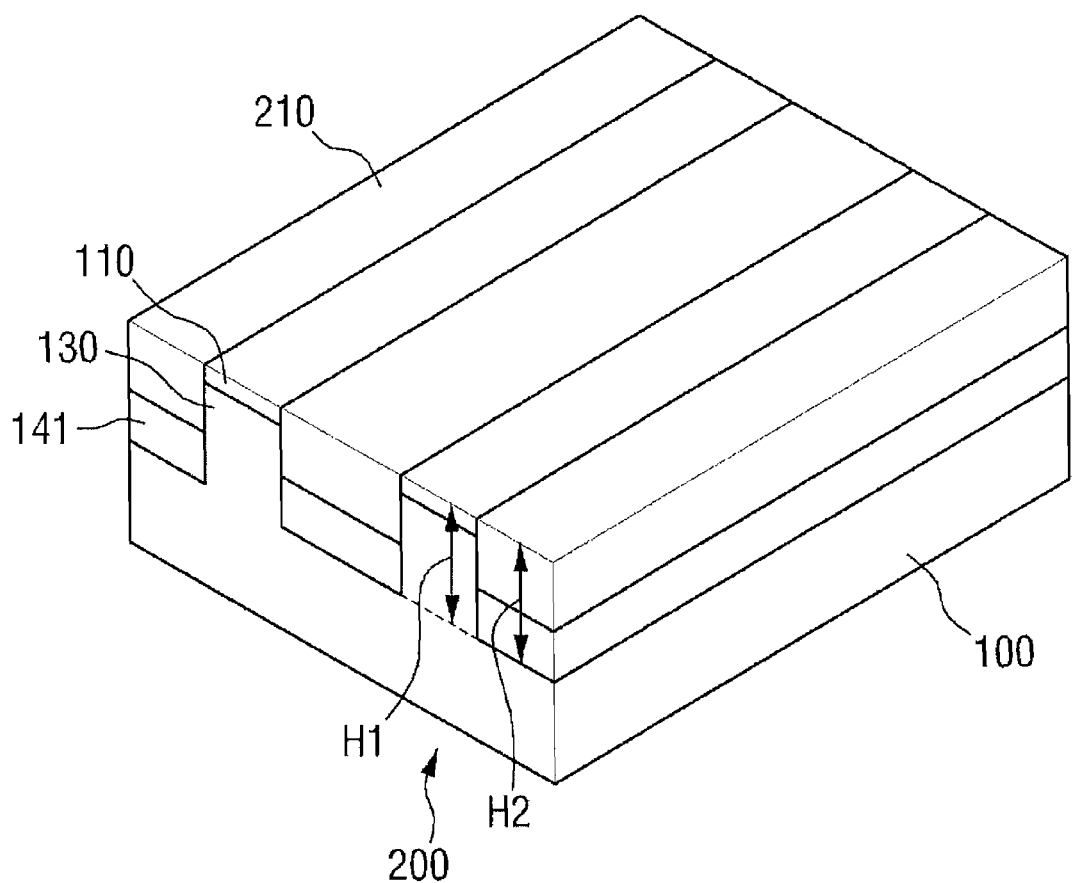

Referring to FIGS. 1 and 9, first dummy gate film 210 may be smoothed (S120), which process also may be referred to as "planarizing," to expose buffer oxide film pattern 110 formed on active fin 130.

In this case, the smoothing of first dummy gate film 210 may be performed through a CMP (Chemical Mechanical Polishing) process, for example. That is, first dummy gate film 210 may be smoothed to expose buffer oxide film pattern 110 by performing CMP with respect to first dummy gate film 210 until buffer oxide film pattern 110 that is formed on active fin 130 is detected as an end point.

In other exemplary embodiments in accordance with principles of inventive concepts, the CMP process may be performed using etching selectivity between buffer oxide film pattern 110 and first dummy gate film 210. That is, by making the etching selectivity between buffer oxide film pattern 110 and first dummy gate film 210 1:10 or more in the CMP process for smoothing first dummy gate film 210, buffer oxide film pattern 110 may be prevented from being excessively etched.

The upper surface of smoothed first dummy gate film 210 and upper surface of buffer oxide film pattern 110 may be positioned at the same height. That is, the height H2 of the upper surface of first dummy gate film 210, as measured from the upper surface of base 100, may be equal to the height H1 of the upper surface of buffer oxide film pattern 110, as measured from the upper surface of base 100.

Figure 10:
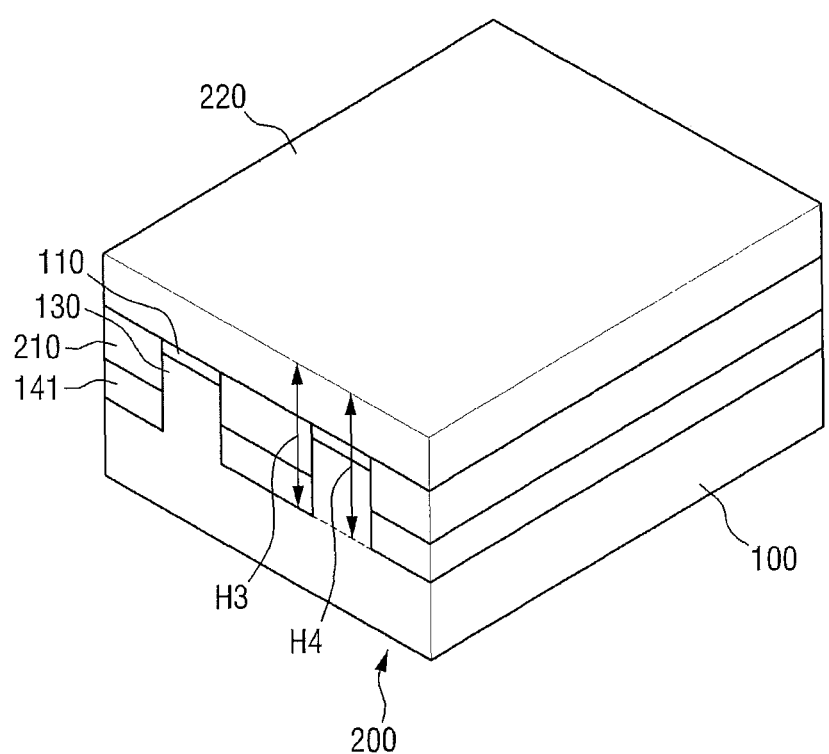

Referring to FIGS. 1 and 10, a second dummy gate film 220 may be formed (S130). In this exemplary embodiment in accordance with principles of inventive concepts, second dummy gate film 220 may be formed on exposed buffer oxide film pattern 110 and first dummy gate film 210. Second dummy gate film 220 may be formed on exposed buffer oxide film pattern 110 and first dummy gate film 210 through a process such as a PVD (Plasma Vapor Deposition) or CVD (Chemical Vapor Deposition), for example.

The upper surface of second dummy gate film 220 that is formed on isolation film 140 and the upper surface of second dummy gate film 220 that is formed on active fin 130 may be positioned at the same height. That is, the height H3 of the upper surface of second dummy gate film 220 formed on isolation film pattern 141, as measured from the upper surface of base 100, may be equal to the height H4 of the upper surface of second dummy gate film 220 formed on active fin 130, as measured from the upper surface of base 100.

As described above, on second dummy gate film 220 that is formed according to an exemplary embodiment in accordance with principles of inventive concepts, a stepped portion, which otherwise might be caused by the forming of active fin 130, is not formed. Accordingly, without the stepped portion, node separation may be appropriately achieved and, as a result, product reliability may be improved.

Figure 11:
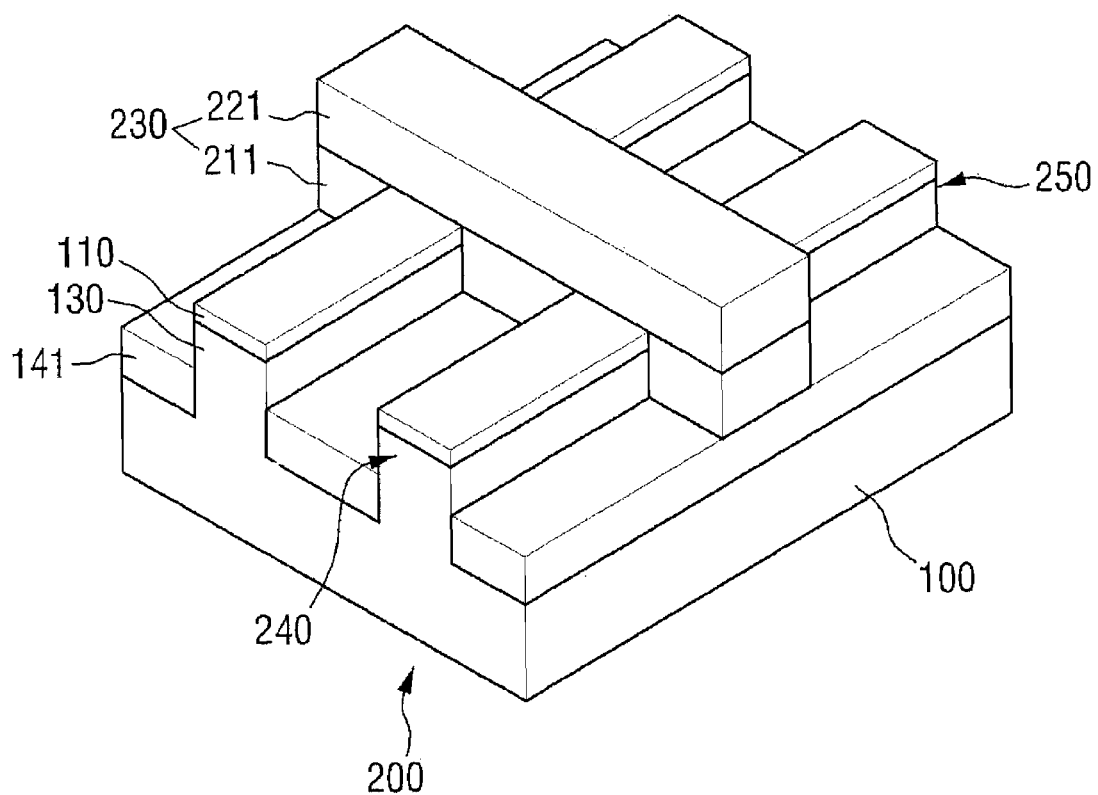

Referring to FIGS. 1 and 11, a dummy gate pattern 230 may be formed (S140). Specifically, dummy gate pattern 230 that includes first and second dummy gate film patterns 211 and 221 may be formed by patterning first and second dummy gate films 210 and 220. In n exemplary embodiment in accordance with principles of inventive concepts, although not illustrated in the drawing, a protection film pattern (not illustrated) that is made of silicon nitride (SiN), for example, may be additionally formed on dummy gate pattern 230.

Once dummy gate pattern 230 is formed, a source region 240 and a drain region 250 may be formed by injecting N-type or P-type impurities into sides of active fin 130 that are exposed by dummy gate pattern 230. In this case, buffer oxide film pattern 110 that is formed on active fin 130 may be removed.

Figure 12:
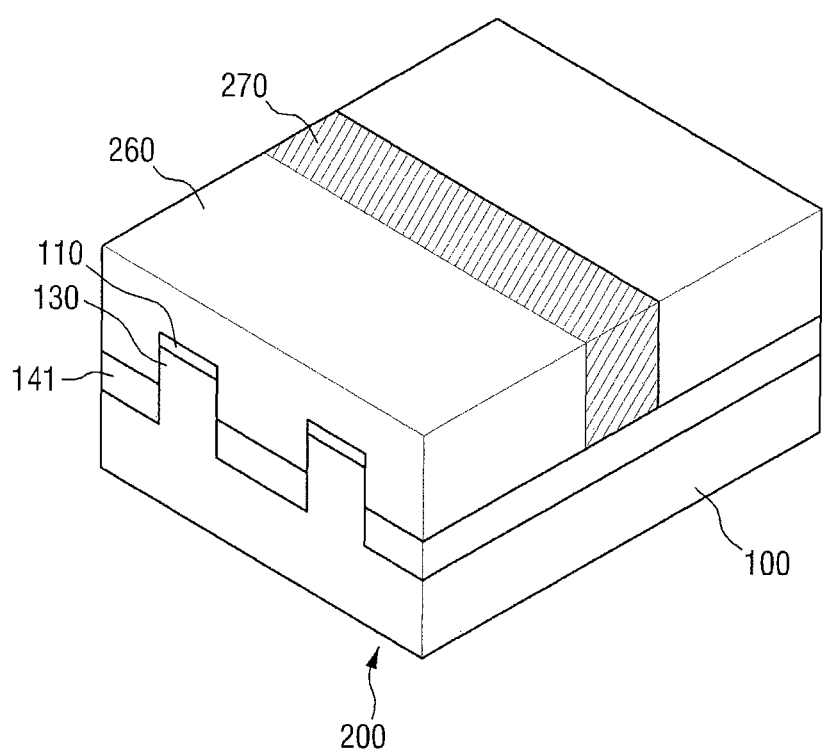

Referring to FIGS. 1, 11, and 12, a metal gate pattern 270 may be formed (S150). Specifically, dummy gate pattern 230 that is formed on active fin 130 may be formed as metal gate pattern 270. This process may be performed in the following order, for example.

In an exemplary embodiment in accordance with principles of inventive concepts, an interlayer insulating film pattern 260 may be formed over the whole surface of substrate 200 illustrated in FIG. 11. In this case, interlayer insulating film pattern 260 may be formed to cover dummy gate pattern 230. Then, interlayer insulating film pattern 260 may be smoothed until dummy gate pattern 230 is exposed. Accordingly, interlayer insulating film pattern 260 may be formed between dummy gate patterns 230.

A portion of active fin 130 may then be exposed by removing dummy gate pattern 230 and buffer oxide film pattern 110 using interlayer insulating film pattern 260 as a mask. Metal gate pattern 270 illustrated in FIG. 12 may be formed by filling metal on exposed active fin 130 and smoothing the metal until interlayer insulating film pattern 260 is exposed, for example.

Metal gate pattern 270 may be formed of aluminum (Al) or metal compounds including the same. Although not illustrated in the drawing, on a contact surface on which metal gate pattern 270 and the active fin 130 are in contact with each other, a gate insulating film (not illustrated), which has a high dielectric constant (high-k), and is made of hafnium oxide (HFO2), hafnium silicate (HFSiO), hafnium silicate nitride (HiSiON), hafnium tantalum oxide (HfTaO), tantalum oxide (Ta2O5), zirconium oxide (ZrO2), aluminum oxide (Al2O3), hafnium aluminum oxide (HfAlO), lanthanum oxide (As2O3), or the like, may be additionally formed. On a side wall of metal gate pattern 270, a gate spacer (not illustrated) that is made of silicon nitride (SiN) or the like may be formed, for example.

Referring to FIGS. 2 to 6, and 9 to 16, a method for fabricating a semiconductor device according to another exemplary embodiment in accordance with principles of inventive concepts will be described.

Figure 13:
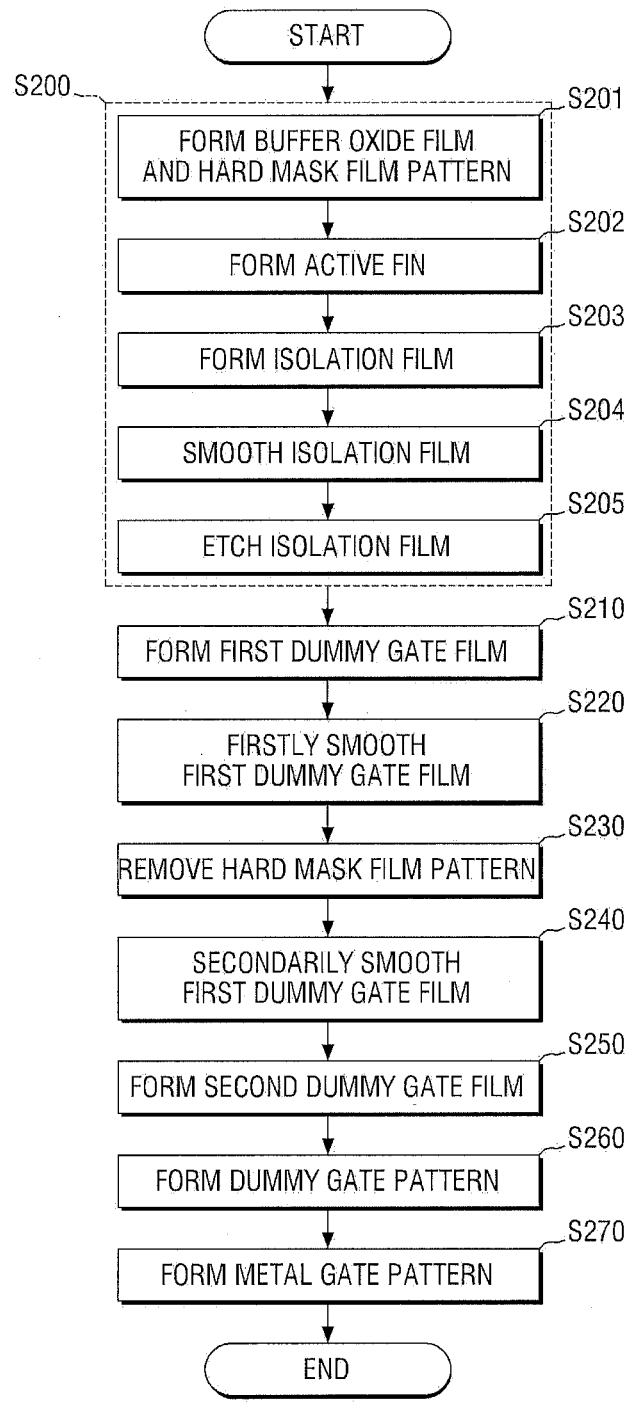
FIG. 13 is a flowchart illustrating a method for fabricating a semiconductor device according to another exemplary embodiment in accordance with principles of inventive concepts.
Figure 14:
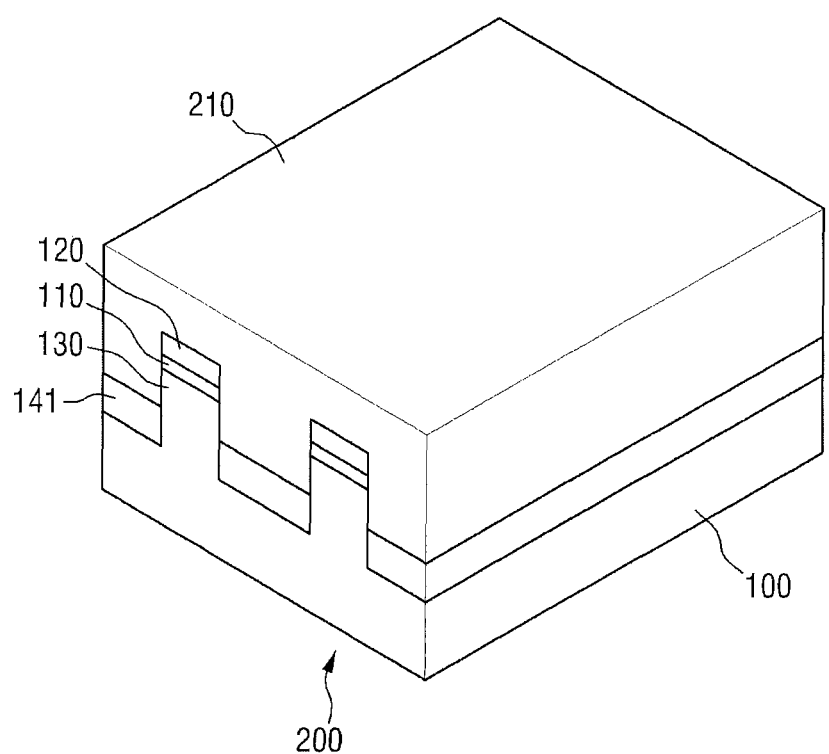
FIGS. 14 to 16 are views explaining intermediate steps of a method for fabricating a semiconductor device according to the exemplary embodiment in accordance with principles of inventive concepts of FIG. 13.
Figure 15:
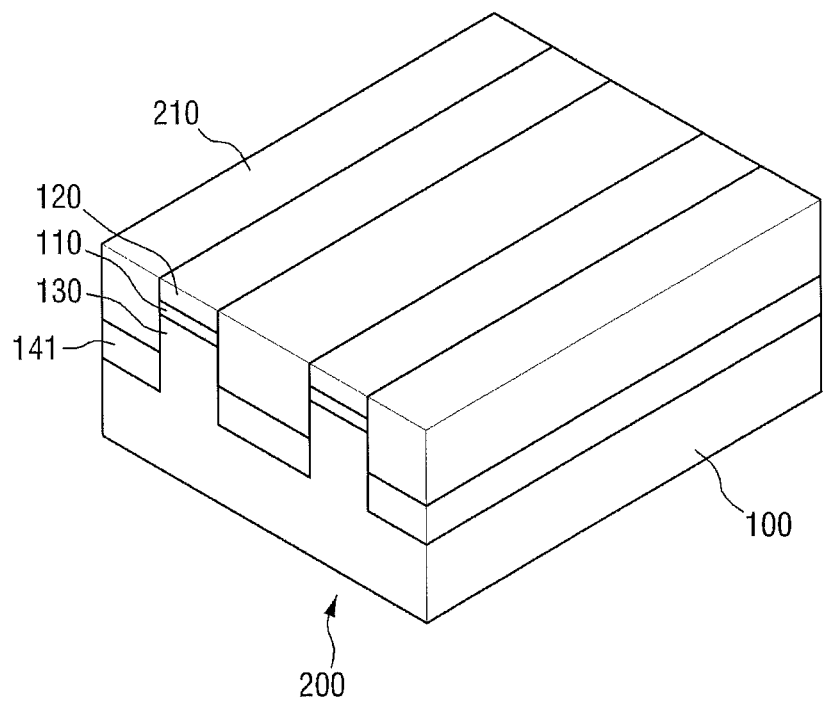
Figure 16:
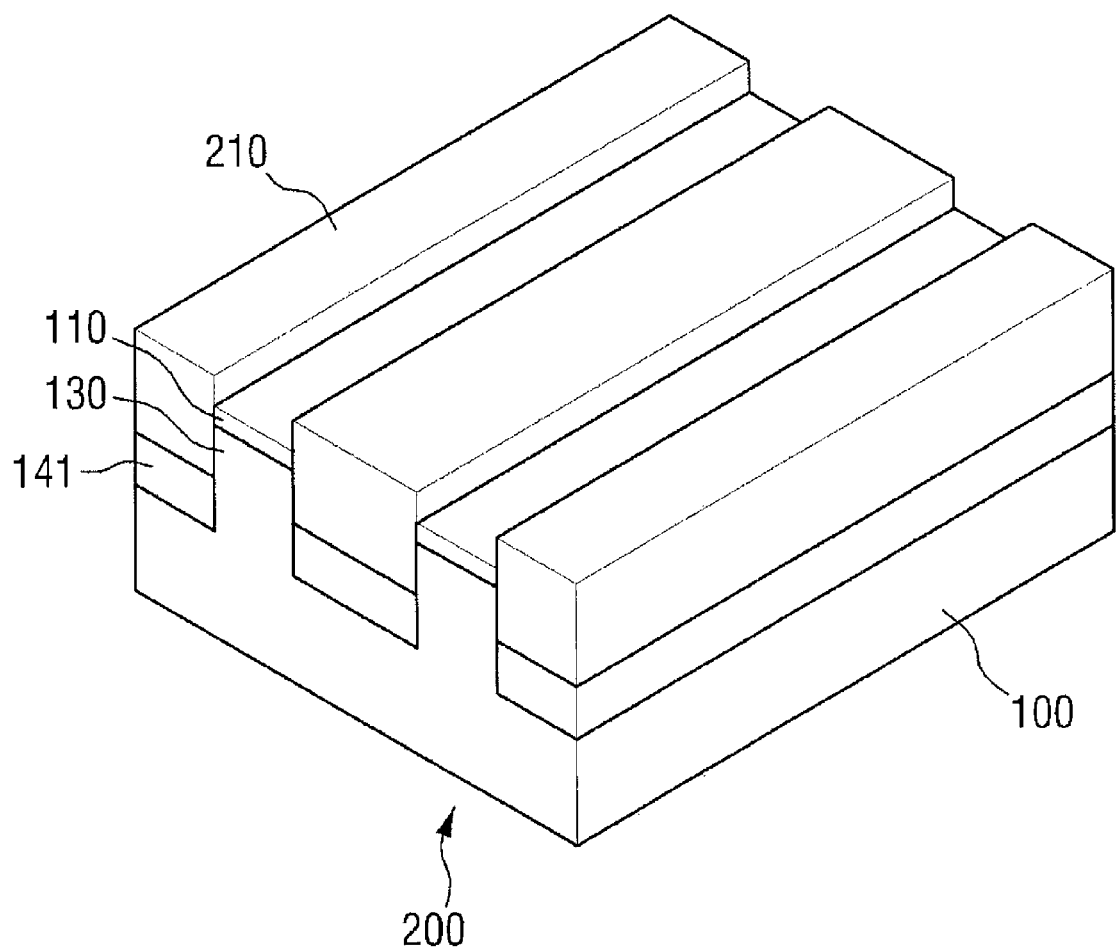

FIG. 13 is a flowchart illustrating a method for fabricating a semiconductor device according to another exemplary embodiment in accordance with principles of inventive concepts, and FIGS. 14 to 16 are views explaining intermediate steps of a method for fabricating a semiconductor device according to another exemplary embodiment in accordance with principles of inventive concepts.

Referring to FIGS. 6 and 13, a substrate 200 may be provided (S200). Substrate 200 may include a base 100, an active fin 130 that projects from an upper surface of base 100 and is integrally formed with base 100, and an end point pattern formed on, and in contact with, active fin 130. In this exemplary embodiment in accordance with principles of inventive concepts, such an end point pattern may be a buffer oxide film pattern 110 and a hard mask film pattern 120 that are sequentially laminated on active fin 130, for example.

That is, according to this exemplary embodiment in accordance with principles of inventive concepts, unlike the above-described embodiment, hard mask film pattern 120 may be included in the end point pattern. Hard mask film pattern 120, for example, may be included in the end point pattern by maintaining hard mask film pattern 120 rather than removing it before first dummy gate film 210 is formed in the above-described embodiment.

Specifically, referring to FIGS. 2 to 6, and 13, buffer oxide film pattern 110 and hard mask film pattern 120 may be formed on base 100 as illustrated in FIG. 2 (S201), and active fin 130 may be formed as illustrated in FIG. 3 by etching base 100 using hard mask film pattern 120 as a mask (S202).

After isolation film 140 is formed on base 100 as illustrated in FIG. 4 (S203), isolation film 140 may be smoothed to expose hard mask film pattern as illustrated in FIG. 5 (S204). Thereafter, an isolation film pattern 141 may be formed as illustrated in FIG. 6 by etching isolation film 140 using exposed hard mask film pattern 120 as a mask, and, thus, substrate 200 may be provided (S205) in an exemplary embodiment in accordance with principles of inventive concepts. That is, in this exemplary embodiment, in providing substrate 200 (S200), hard mask film pattern 120 that is formed on buffer oxide film pattern 110 is not removed as illustrated in FIG. 7.

Referring to FIGS. 13 and 14, first dummy gate film 210 may be formed (S210) on substrate 200 to cover the buffer oxide film pattern 110 and hard mask film pattern 120. First dummy gate film 210 may be made of a material having an etching selectivity with respect to buffer oxide film pattern 110 and hard mask film pattern 120, for example.

Referring to FIGS. 13 and 15, first dummy gate film 210 may be first-smoothed (S220) to expose hard mask film pattern 120 formed on the active fin 130.

The first smoothing process may be performed by an CMP process, for example. That is, first dummy gate film 210 may be smoothed to expose hard mask film pattern 120 by performing a CMP with respect to first dummy gate film 210 until hard mask film pattern 120 that is formed on active fin 130 is detected as an end point. Alternatively, the above-described first smoothing (CMP) process may be performed using etching selectivity between hard mask film pattern 120 and first dummy gate film 210.

Referring to FIGS. 13 and 16, hard mask pattern 120 may be removed (S230). Specifically, buffer oxide film pattern 110 may be exposed by removing hard mask film pattern 120, as illustrated, through an etching process using the etching selectivity among first dummy gate film 141, buffer oxide film pattern 110, and hard mask film pattern 120, for example.

Referring to FIGS. 9 and 13, first dummy gate film 210 may be secondly-smoothed (S240) so that the upper surface of exposed buffer oxide film pattern 110 and the upper surface of first dummy gate film 210 are positioned at the same height H1 and H2. The second smoothing may be performed by performing a CMP with respect to first dummy gate film 210 until buffer oxide film pattern 110 is detected as the end point, and the CMP process may be performed using an etching selectivity between buffer oxide film pattern 110 and first dummy gate film 210.

Referring to FIGS. 10 to 13, a second dummy gate film 220 may be formed on exposed buffer oxide film pattern 110 and first dummy gate film 210, as illustrated in FIG. 10 (S250). A dummy gate pattern 230 that includes first and second dummy gate film patterns 211 and 221 may then be formed by patterning first and second dummy gate films 210 and 220 as illustrated in FIG. 11 (S260), for example. Thereafter, dummy gate pattern 230 that is formed on the active fin 130 may be formed as metal gate pattern 270 that is made of a metal to complete the semiconductor device as illustrated in FIG. 12 (S270). Since the process has been described sufficiently and in detail in the above-described embodiments, the duplicate description thereof will be omitted.

As in this exemplary embodiment in accordance with principles of inventive concepts, by firstly smoothing hard mask film pattern 120 as the first end point film and secondarily smoothing buffer oxide film pattern 110 as the second end point film in smoothing the first dummy gate film 210, a loss of the buffer oxide film pattern 110 is minimized in the process of smoothing first dummy gate film 210. That is, in this exemplary embodiment, since the thickness of first dummy gate film 210 to be smoothed is relatively smaller, or thinner, than that according to the above-described exemplary embodiments in the process of smoothing buffer oxide film pattern 110 as the end point film, the loss of buffer oxide film pattern 110 in the smoothing process may be minimized.

Although preferred embodiments of the present inventive concepts have been described for illustrative purposes, those skilled in the art will appreciate that various modifications, additions and substitutions are possible, without departing from the scope and spirit of the inventive concepts, as disclosed in the accompanying claims.

What is claimed is:

1. A method for fabricating a semiconductor device comprising:
providing a substrate that includes a base, an active fin that projects from an upper surface of the base and is integrally formed with the base, and a buffer oxide film pattern formed on the active fin in contact with the active fin;
forming a first dummy gate film on the substrate to cover the buffer oxide film pattern;
smoothing the first dummy gate film to expose the buffer oxide film pattern; and
forming a second dummy gate film on the exposed buffer oxide film pattern and the first dummy gate film.

2. The method for fabricating a semiconductor device of claim 1, wherein smoothing the first dummy gate film comprises smoothing the first dummy gate film through a CMP process using etching selectivity between the buffer oxide film pattern and the first dummy gate film.

3. The method for fabricating a semiconductor device of claim 2, wherein the first dummy gate film and the second dummy gate film include the same material.

4. The method for fabricating a semiconductor device of claim 1, wherein the substrate further includes an isolation film pattern formed on the base to expose an upper side wall of the active fin; and
wherein providing the substrate comprises:
forming the buffer oxide film pattern and a hard mask film pattern on the substrate; and
forming the active fin and the isolation film pattern using the hard mask film pattern.

5. The method for fabricating a semiconductor device of claim 4, wherein the forming the active fin and the isolation film pattern using the hard mask film pattern comprises:
forming the active fin by etching the base using the hard mask film pattern as a mask;
forming the isolation film on the base to cover the hard mask film pattern;
smoothing the isolation film to expose the hard mask film pattern; and
forming the isolation film pattern that exposes an upper side wall of the active fin by etching the isolation film using the exposed hard mask film pattern as a mask.

6. The method for fabricating a semiconductor device of claim 5, further comprising removing the hard mask film pattern.

7. The method for fabricating a semiconductor device of claim 4, wherein an upper surface of the second dummy gate film that is formed on the isolation film pattern and an upper surface of the second dummy gate film that is formed on the active fin are positioned at a same height relative to the base.

8. The method for fabricating a semiconductor device of claim 1, wherein the substrate further includes a hard mask film pattern formed on the buffer oxide film pattern;
wherein the forming the first dummy gate film further comprises forming the first dummy gate film to cover the hard mask film pattern, and
the smoothing the first dummy gate film comprises:
firstly smoothing the first dummy gate film to expose the hard mask film pattern, exposing the buffer oxide film pattern by removing the hard mask film pattern, and
secondarily smoothing the first fumy gate film so that an upper surface of the exposed buffer oxide film pattern and an upper surface of the first dummy gate film are positioned at a same height relative to the base.

9. The method for fabricating a semiconductor device of claim 8, wherein the removing the hard mask film pattern comprises removing the hard mask film pattern through an etching process using etching selectivity among the first dummy gate film, the buffer oxide film pattern, and the hard mask film pattern.

10. A method for fabricating a semiconductor device comprising:
providing a substrate that includes a base, an active fin that projects from an upper surface of the base and is integrally formed with the base, and an end point pattern formed on the active fin in contact with the active fin;
forming a first dummy gate film on the substrate to cover the end point pattern;
smoothing the first dummy gate film to expose the smoothed end point pattern;
forming a second dummy gate film on the exposed smoothed end point pattern and the first dummy gate film;
forming a dummy gate pattern by patterning the first and second dummy gate films; and
forming a metal gate pattern that comprising a metal after removing the dummy gate pattern.

11. The method for fabricating a semiconductor device of claim 10, wherein the end point pattern is a buffer oxide film pattern.

12. The method for fabricating a semiconductor device of claim 10, wherein the end point pattern includes a buffer oxide film pattern that is formed to be in contact with the active fin and a hard mask film pattern that is formed on the buffer oxide film pattern;
wherein the forming the first dummy gate film further comprises forming the first dummy gate film to cover the hard mask film pattern,
the smoothing the first dummy gate film comprises:
firstly smoothing the first dummy gate film to expose the hard mask film pattern, exposing the buffer oxide film pattern by removing the hard mask film pattern, and
secondarily smoothing the first fumy gate film so that the upper surface of the exposed buffer oxide film pattern and the upper surface of the first dummy gate film are positioned at a same height relative to the base; and
the forming the second dummy gate film comprises forming the second dummy gate film on the exposed buffer oxide film pattern and the first dummy gate film.

13. The method for fabricating a semiconductor device of claim 10, further comprising forming a source region and a drain region on the active fin, on either side of the dummy gate pattern, after forming the dummy gate pattern.

14. The method for fabricating a semiconductor device of claim 10, wherein forming the dummy gate pattern as the metal gate pattern comprises:
forming an interlayer insulating film pattern between the dummy gate patterns;
exposing the active fin by removing the dummy gate pattern and the end point pattern using the interlayer insulating film pattern as a mask; and
forming the metal gate pattern by filling the metal on the active fin.

15. The method for fabricating a semiconductor device of claim 14, wherein the metal includes aluminum (Al).

* * * * *